United States Patent
Lin et al.

(10) Patent No.: US 11,121,312 B2
(45) Date of Patent: Sep. 14, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Tai-Cheng Hou, Tainan (TW); Bin-Siang Tsai, Changhua County (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 60 days.

(21) Appl. No.: 16/563,924

(22) Filed: Sep. 8, 2019

(65) Prior Publication Data

US 2021/0050511 A1   Feb. 18, 2021

(30) Foreign Application Priority Data

Aug. 14, 2019   (TW) .................................. 108128913

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 8,482,966 B2 | 7/2013 | Kang et al. | |
| 9,818,935 B2 | 11/2017 | Chuang et al. | |
| 10,002,905 B2 | 6/2018 | Park et al. | |
| 10,153,427 B1 | 12/2018 | Shen et al. | |
| 10,276,779 B2 * | 4/2019 | Chang | H01L 43/12 |
| 2002/0114722 A1 * | 8/2002 | Kimmel | C01G 33/00 419/45 |
| 2015/0021725 A1 | 1/2015 | Hsu et al. | |
| 2021/0043721 A1 * | 2/2021 | Shih | H01L 28/75 |

FOREIGN PATENT DOCUMENTS

WO   2011053350   5/2011

OTHER PUBLICATIONS

Callori, Title: Hydrogen Absorption in Metal Thin Films and Heterostructures Investigated in Situ with Neutron and X-ray Scattering; Metals 2016, 6, 125, May 24, 2016.

* cited by examiner

*Primary Examiner* — Robert K Carpenter
(74) *Attorney, Agent, or Firm* — Winston Hsu

(57) ABSTRACT

A method for fabricating semiconductor device includes the steps of: forming an inter-metal dielectric (IMD) layer on a substrate; forming a metal interconnection in the IMD layer; forming a magnetic tunneling junction (MTJ) on the metal interconnection; forming a top electrode on the MTJ; and forming a trapping layer on the top electrode for trapping hydrogen. Preferably, the trapping layer includes a concentration gradient, in which a concentration of hydrogen decreases from a top surface of the top electrode toward the MTJ.

16 Claims, 5 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming an inter-metal dielectric (IMD) layer on a substrate; forming a metal interconnection in the IMD layer; forming a magnetic tunneling junction (MTJ) on the metal interconnection; forming a top electrode on the MTJ; and forming a trapping layer on the top electrode for trapping hydrogen. Preferably, the trapping layer includes a concentration gradient, in which a concentration of hydrogen decreases from a top surface of the top electrode toward the MTJ.

According to another aspect of the present invention, a semiconductor device preferably includes: a magnetic tunneling junction (MTJ) on a substrate; a top electrode on the MTJ; and a trapping layer on the top electrode for trapping hydrogen. Preferably, the trapping layer includes a concentration gradient, in which a concentration of hydrogen decreases from a top surface of the top electrode toward the MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
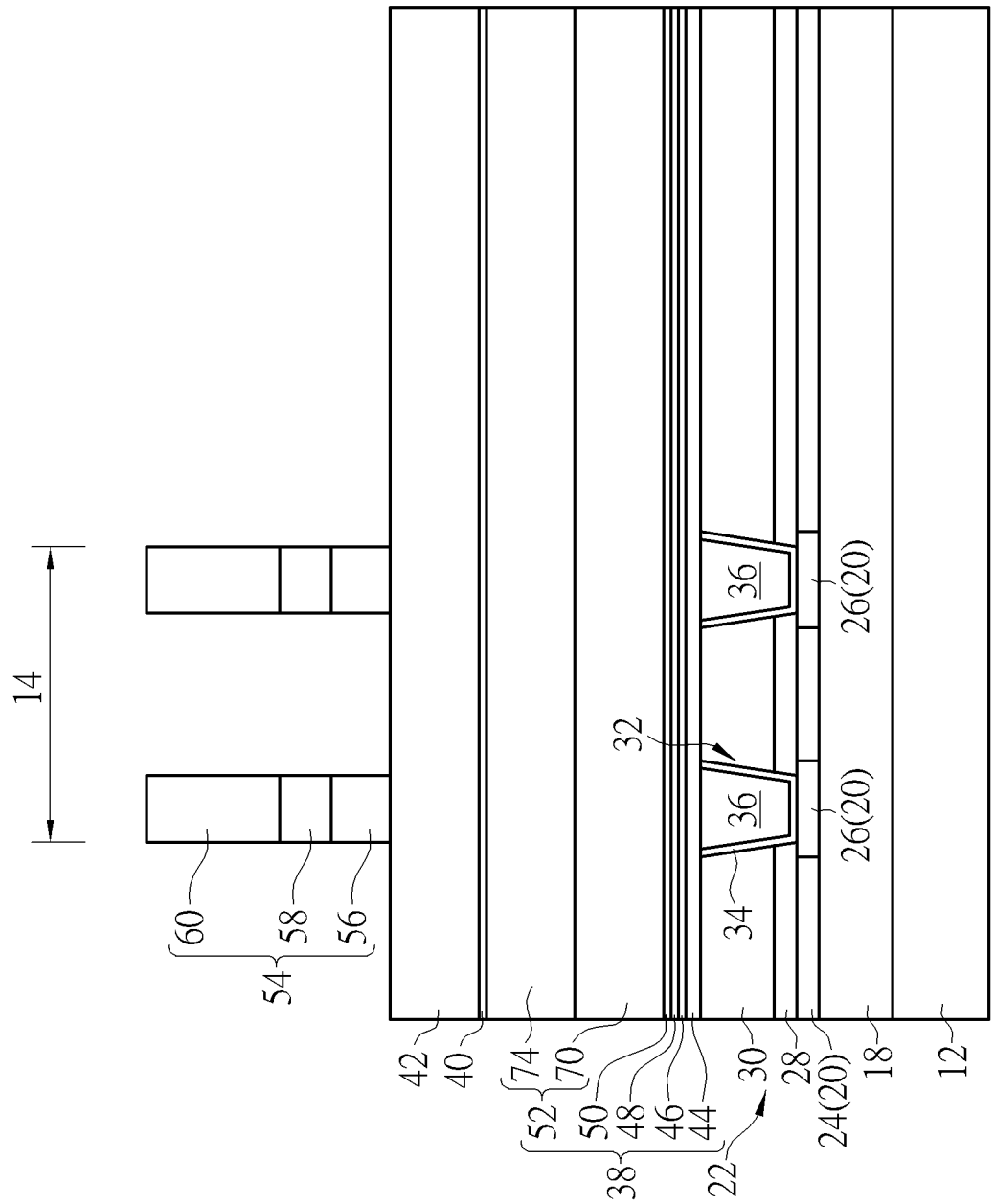
FIGS. 1-5 illustrate a method for fabricating a MRAIVI device according to an embodiment of the present invention.

Referring to FIGS. 1-5, FIGS. 1-5 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ti, Ta, Pt, Cu, Au, Al, or combination thereof, in which the second electrode layer 52 further includes an electrode layer 70 disposed on the surface of the MTJ stack 38 and another electrode layer 74 disposed on the electrode layer 70. Specifically, the electrode layer 70 is preferably made of metal nitride while the electrode layer 74 is made of metal, in which the electrode layer 70 is preferably made of titanium nitride (TiN) in this embodiment and the electrode layer 74 is made of tantalum (Ta).

The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
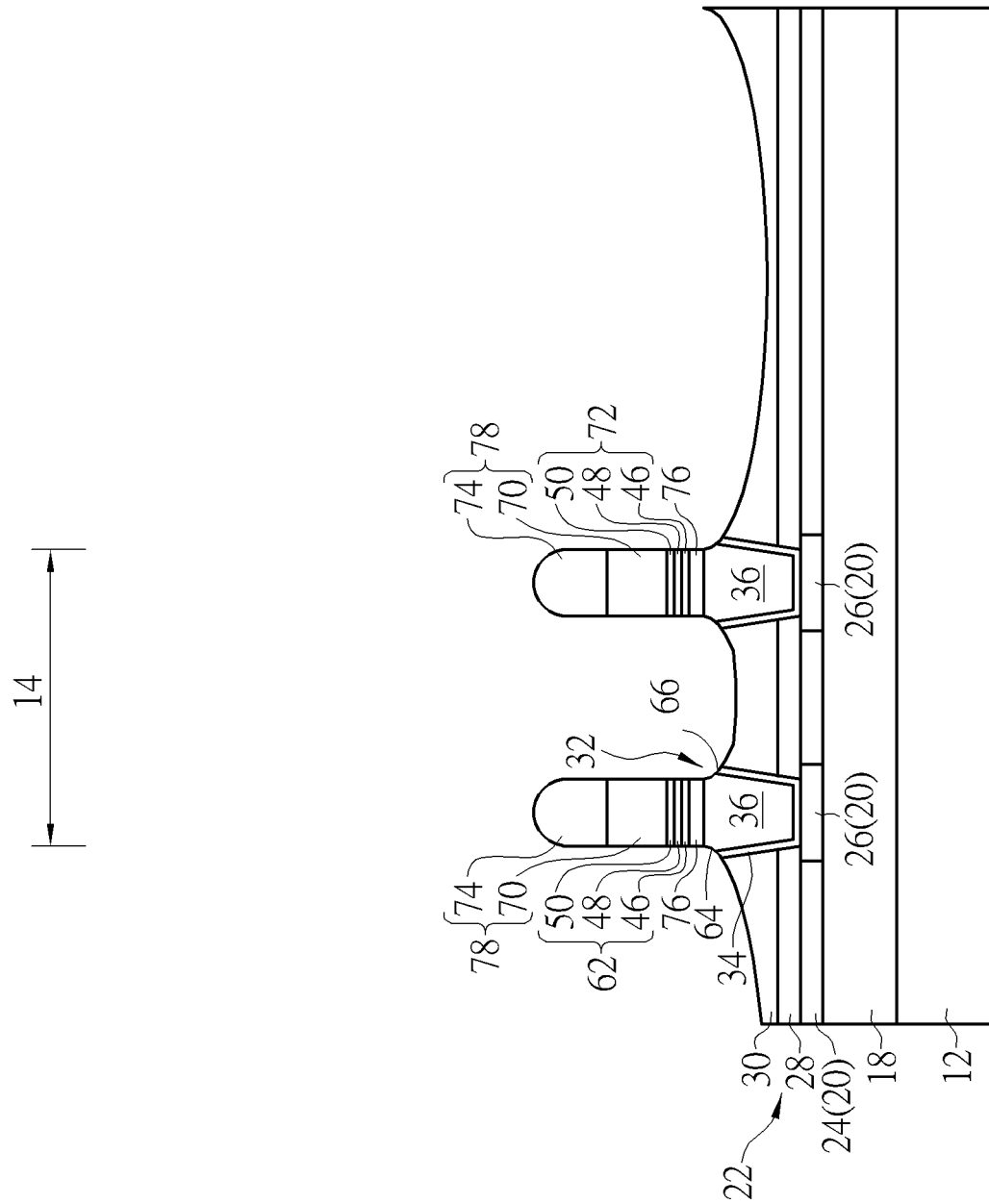

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
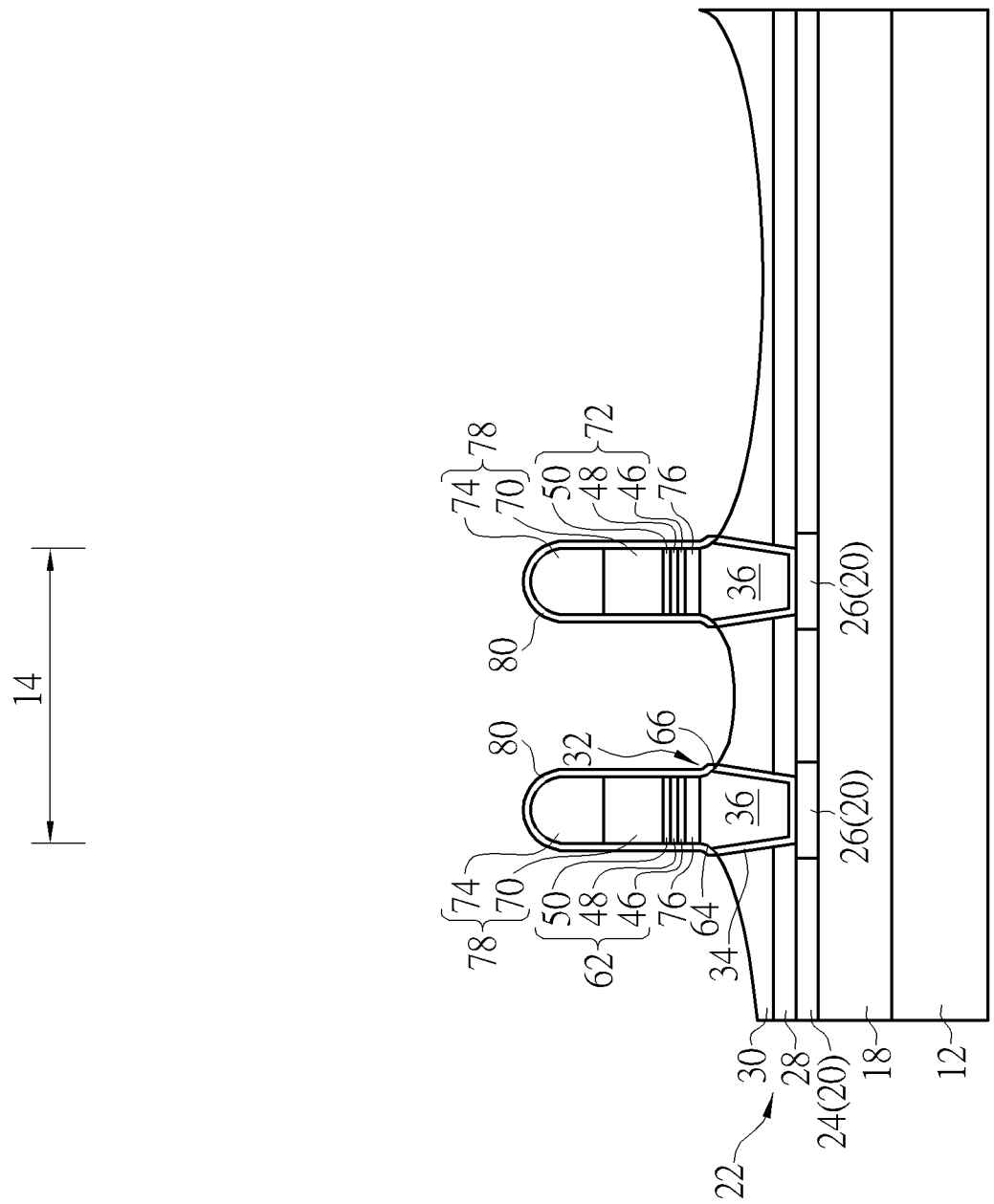

Next, as shown in FIG. 3, an oxidation process is conducted to form a passivation layer 80 made of silicon oxide on the MTJs 62, 72, in which the passivation layer 80 preferably covers the top surface and sidewalls of the top electrodes 78, sidewalls of the MTJs 62, 72, and sidewalls of the bottom electrodes 76.

Figure 4:
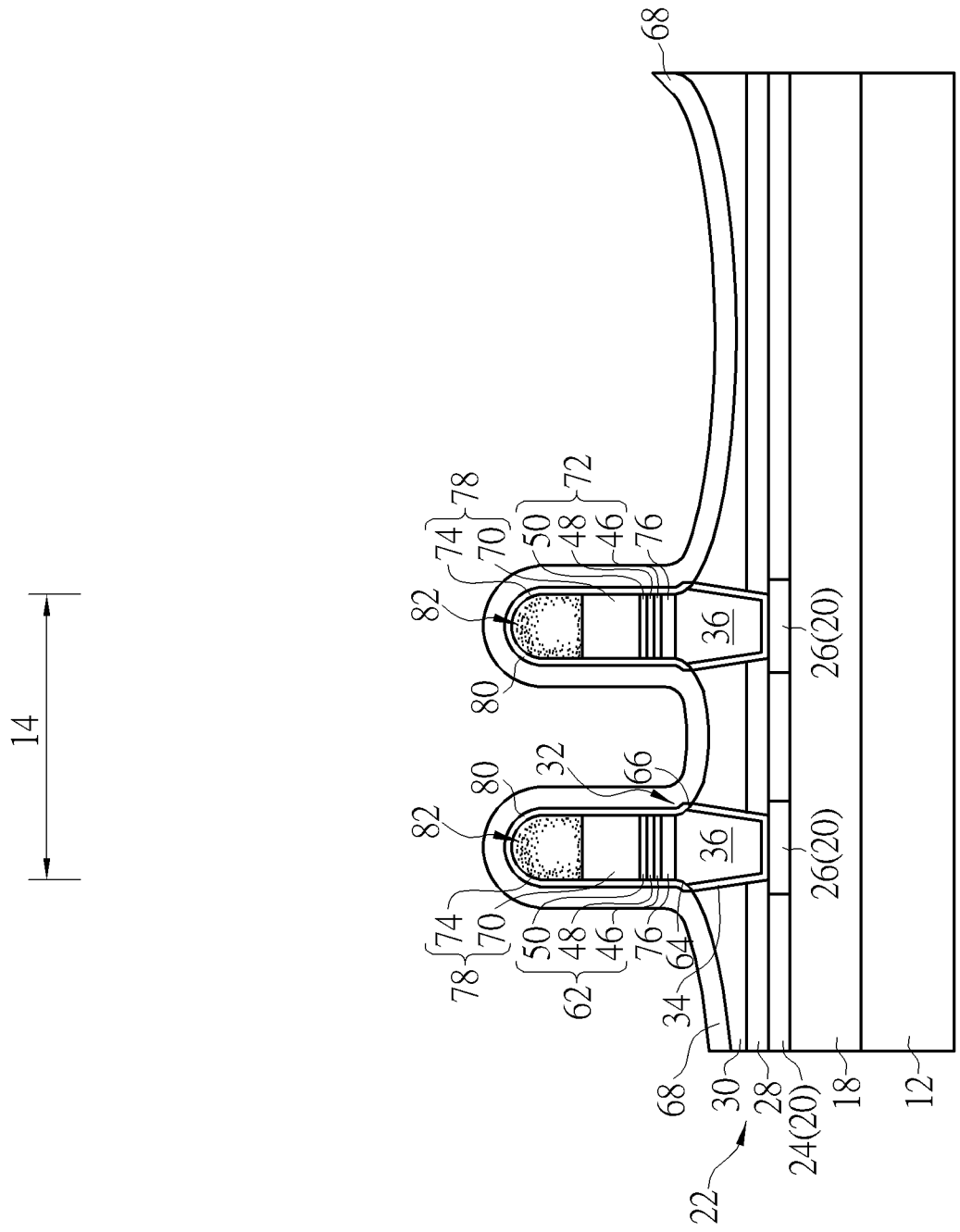

Next, as shown in FIG. 4, a cap layer 68 is formed on the passivation layer 80 to cover the surface of the IMD layer 30. In this embodiment, the cap layer 68 is preferably made of silicon nitride, but could also be made of other dielectric material including but not limited to for example silicon oxide, silicon oxynitride, or silicon carbon nitride. It should be noted that the present invention preferably injects ammonia gas and/or silane as reacting gas for forming the cap layer 68 and as the cap layer 68 is formed, hydrogen atoms contained within ammonia and/or silane also precipitates or diffuses downward into the top electrodes 78 to form a trapping layer 82, as illustrated by the concentrated dots shown in top electrodes 78. In this embodiment, if the electrode layer 74 of the top electrode 78 were made of Ta, the trapping layer 82 formed would preferably include tantalum hydride (TaH) and the trapping layer 82 itself could be used to trap hydrogen and prevent additional hydrogen gas from later process to penetrate the top electrode 78 and further diffuse downward into the MTJs 62, 72 underneath and affect the magnetic performance of the device. It should be further noted that the trapping layer 82 also includes a concentration gradient that the concentration of hydrogen preferably decreases from a top surface of the top electrode 78 toward the MTJs 62, 72. In other words, the region closer to the topmost surface of the top electrode 78 preferably includes higher concentration of hydrogen atoms whereas the region closer to the boundary between the electrode layers 70 and 74 includes lower concentration of hydrogen atoms.

Figure 5:
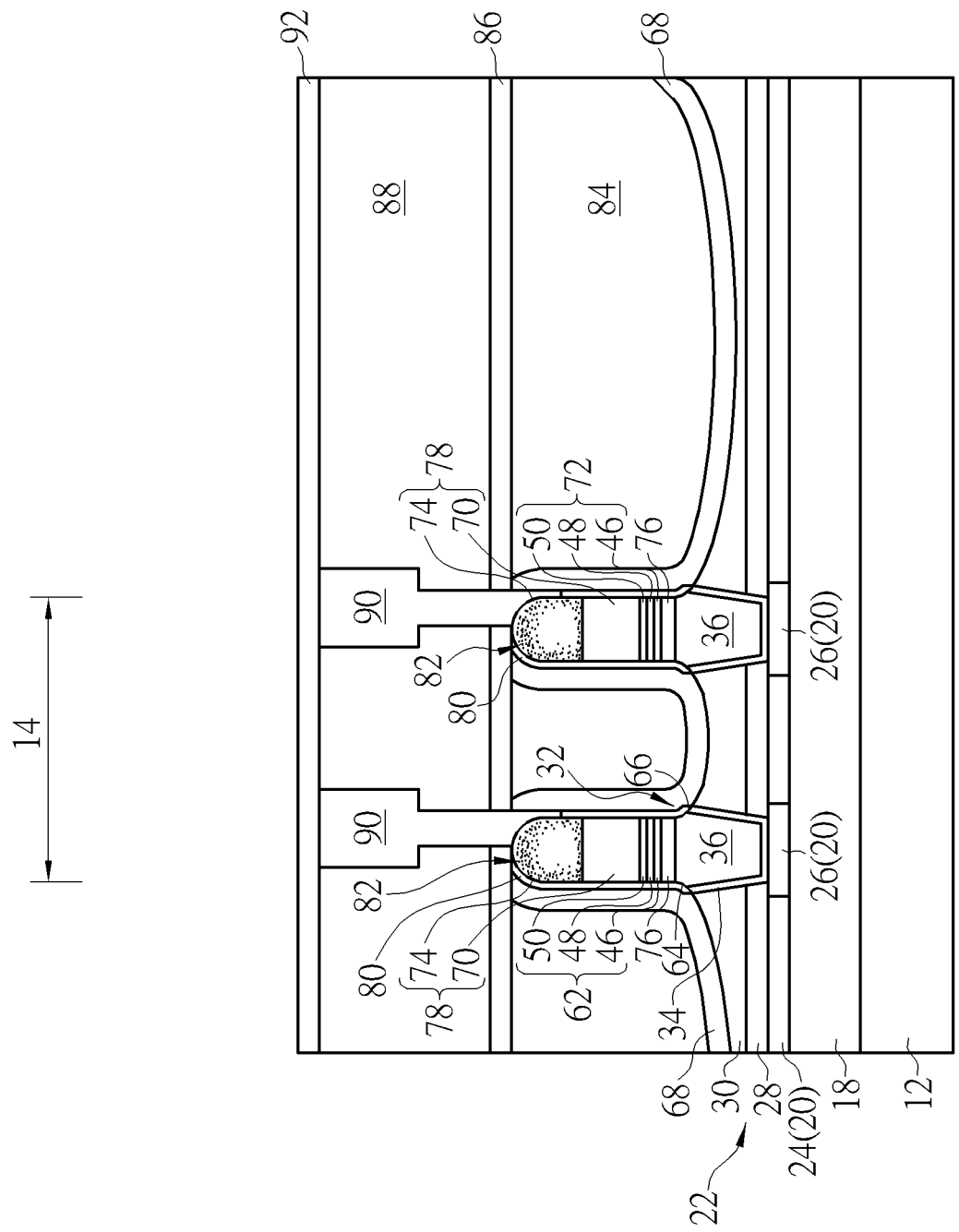

Next, as shown in FIG. 5, another IMD layer 84 is formed on the MTJ region 14 and the logic region and a planarizing process such as chemical mechanical polishing (CMP) process is conducted to remove part of the IMD layer 84 and even part of the cap layer 68 to expose the top electrodes 78. Next, a stop layer 86 and another IMD layer 88 are formed on the surface of the IMD layer 84 and one or more photo-etching process is conducted to remove part of the IMD layer 88, part of the stop layer 86, part of the passivation layer 80, and even part of the cap layer 68 adjacent to the top electrodes 78 to form contact holes (not shown). Next, conductive materials are deposited into each of the contact holes and a planarizing process such as CMP is conducted to form metal interconnections 90 directly connecting the top electrodes 78. Next, another stop layer 92 is formed on the IMD layer 88 to cover the metal interconnections 90.

In this embodiment, the stop layer 92 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 90 could be formed in the IMD layer 88 according to a single damascene or dual damascene process. For instance, each of the metal interconnections 90 could further include a barrier layer (not shown) and a metal layer (not shown), in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device preferably includes at least a MTJ 62 disposed on the substrate 12 on the MTJ region 14, a passivation layer 80 disposed on part of the sidewalls of the MTJ 62, a cap layer 68 disposed on sidewalls of the passivation layer 80, an IMD layer 84 surrounding the MTJ 62, a metal interconnection 32 directly contacting the bottom electrode 76, a metal interconnection 90 directly contacting the top surface and part of the sidewalls of the top electrode 78, an IMD layer 88 surrounding the metal interconnection 90, a stop layer 86 between the IMD layer 84 and IMD layer 88, and a stop layer 92 disposed on the metal interconnection 90 and IMD layer 88.

In this embodiment, the MTJ 62 preferably includes a fixed layer 46, a barrier layer 48, and a free layer 50, and the top electrode 78 disposed directly on top of the MTJ 62 preferably includes a trapping layer 82 for trapping hydrogen. In this embodiment, if the electrode layer 74 of the top electrode 78 were made of Ta, the trapping layer 82 formed would preferably include tantalum hydride (TaH) and the trapping layer 82 itself could be used to trap hydrogen and prevent additional hydrogen gas generated in later process from penetrating through the top electrode 78 and further diffusing downward into the MTJs 62, 72 underneath to affect the magnetic performance of the device. Moreover, the trapping layer 82 also includes a concentration gradient that the concentration of hydrogen preferably decreases from a top surface of the top electrode 78 toward the MTJs 62, 72. In other words, the region closer to the topmost surface of the top electrode 78 preferably includes higher concentration of hydrogen atoms whereas the region closer to the boundary between the electrode layers 70 and 74 includes lower concentration of hydrogen atoms.

Typically, current fabrication of MRAM device often injects one or more reacting gas containing hydrogen during certain stages of the fabrication process such as during the formation of the cap layer 68, during the formation of IMD layers 84, 88 made of ultra low-k (ULK) dielectric material, and/or during the formation of stop layers 86, 92 made of nitrogen doped carbide (NDC), in which the hydrogen atoms carried by the reacting gas often diffuses into the MTJ to affect the magnetic performance of the device. To resolve this issue the present invention preferably forms a trapping layer in part of the top electrode after forming the MTJ to stop or prevent hydrogen atoms generated from various stages of the fabrication process from passing through the top electrode to enter the MTJ and affect the magnetic performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first inter-metal dielectric (IMD) layer on a substrate;
   forming a first metal interconnection in the first IMD layer;
   forming a magnetic tunneling junction (MTJ) on the first metal interconnection;
   forming a top electrode on the MTJ; and
   injecting a reacting gas to form a cap layer on the top electrode and adjacent to the MTJ and at the same time forming a trapping layer in the top electrode for trapping hydrogen, wherein the cap layer comprises a dielectric layer and contacts the first IMD layer directly.

2. The method of claim 1, further comprising:
   forming a cap layer on the IMD layer and the MTJ;
   forming a second IMD layer on the first IMD layer and the MTJ;
   forming a stop layer on the first IMD layer;
   forming a third IMD layer on the stop layer; and
   forming a second metal interconnection in the third IMD layer to electrically connect the MTJ.

3. The method of claim 1, wherein the top electrode comprises:
   a first electrode layer on the MTJ; and
   a second electrode layer on the first electrode layer.

4. The method of claim 3, wherein the first electrode layer comprises titanium nitride (TiN).

5. The method of claim 3, wherein the second electrode layer comprises tantalum (Ta).

6. The method of claim 1, wherein the trapping layer comprises tantalum hydride (TaH).

7. The method of claim 6, wherein the trapping layer comprises a concentration gradient.

8. The method of claim 7, wherein a concentration of hydrogen decreases from a top surface of the top electrode toward the MTJ.

9. A semiconductor device, comprising:
   a first inter-metal dielectric (IMD) layer on a substrate;
   a first metal interconnection in the first IMD layer;
   a magnetic tunneling junction (MTJ) on the first metal interconnection;
   a top electrode on the MTJ;
   a trapping layer in the top electrode for trapping hydrogen; and
   a cap layer on the top electrode and the trapping layer, wherein the cap layer comprises a dielectric layer and contacts the first IMD layer directly.

10. The semiconductor device of claim 9, further comprising:
    a cap layer on the IMD layer;
    a second IMD layer around the MTJ;
    a stop layer on the second IMD layer;
    a third IMD layer on the stop layer; and
    a second metal interconnection in the third IMD layer to electrically connect the MTJ.

11. The semiconductor device of claim 9, wherein the top electrode comprises:
    a first electrode layer on the MTJ; and
    a second electrode layer on the first electrode layer.

12. The semiconductor device of claim 11, wherein the first electrode layer comprises titanium nitride (TiN).

13. The semiconductor device of claim 11, wherein the second electrode layer comprises tantalum (Ta).

14. The semiconductor device of claim 9, wherein the trapping layer comprises tantalum hydride (TaH).

15. The semiconductor device of claim 14, wherein the trapping layer comprises a concentration gradient.

16. The semiconductor device of claim 15, wherein a concentration of hydrogen decreases from a top surface of the top electrode toward the MTJ.

* * * * *